(12) United States Patent
Katoh

(10) Patent No.: US 6,589,870 B1
(45) Date of Patent: Jul. 8, 2003

(54) INTER-LAYER CONNECTION STRUCTURE, MULTILAYER PRINTED CIRCUIT BOARD AND PRODUCTION PROCESSES THEREFOR

(75) Inventor: Takashi Katoh, Shigan-ken (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/498,222

(22) Filed: Feb. 4, 2000

(30) Foreign Application Priority Data

Feb. 5, 1999 (JP) .............................. 11-028736

(51) Int. Cl.[7] .......................................... H01L 21/302
(52) U.S. Cl. ..................... 438/690; 438/700; 438/701; 438/702
(58) Field of Search ................. 438/690, 700, 438/701, 702

(56) References Cited

U.S. PATENT DOCUMENTS 5,092,032 A * 3/1992 Murakami ................... 29/380
5,200,026 A * 4/1993 Okabe ......................... 156/651
5,219,787 A * 6/1993 Carey et al. ................. 437/187
5,305,519 A * 4/1994 Yamamoto et al. .......... 438/623
5,483,984 A   1/1996 Donlan, Jr. et al.
5,738,797 A * 4/1998 Belke, Jr. et al. ............ 216/16
5,883,219 A * 3/1999 Carter et al. ................ 528/310
6,119,338 A * 9/2000 Wang et al. .................. 29/852

FOREIGN PATENT DOCUMENTS

JP          7-10030         7/1995

* cited by examiner

*Primary Examiner*—Benjamin L. Utech
*Assistant Examiner*—Vanessa Perez-Ramos
(74) *Attorney, Agent, or Firm*—John A. Jordan; Arthur J. Samodovitz

(57) ABSTRACT

A process for forming a bump via to interconnect upper and lower circuits wherein a layer of metal is etched down, leaving a bump via and a lower portion of the layer. A lower circuit pattern is then formed in the lower portion, following which the pattern and bump via are covered with an insulating layer. Smoothing then results in the top surface of the bump via being exposed such that an upper circuit can then be formed on the insulating layer and in connection with said bump via.

20 Claims, 9 Drawing Sheets

INTER-LAYER CONNECTION STRUCTURE, MULTILAYER PRINTED CIRCUIT BOARD AND PRODUCTION PROCESSES THEREFOR

FIELD OF THE INVENTION

The present invention relates to an inter-layer connection structure, a multi-layer printed circuit board (PCB), and production processes therefor. More particularly, the invention relates to an inter-layer connection structure which allows high density packaging and high density wiring, and to a built-up printed circuit board with the structure.

BACKGROUND OF THE INVENTION

In known methods of the above type, an insulating layer having a thickness of 40 to 80 μm (micrometers) may be used. Vias (openings) 100 μm or less in diameter formed in the insulator occasionally fail to meet desired yields due to residue of insulator in the bottom of the vias. Inadequate stability or reliability of inter-layer connection due to insufficient conditioning or cleaning of conductor pads under the vias before plating may also occur, depending on the insulator material or process method.

One conventional method for producing a stud bump interconnection structure as part of a PCB is referred to as a via post method. As shown in FIGS. 6(a) to 6(f), this method comprises the steps of: (a) forming a lower circuit layer 102 on a core circuit board 100; (b) depositing a thin conductive layer 104 over the lower circuit layer (e.g., by electroless plating), then applying or laminating a plating resist 106 on the conductive layer, and thereafter removing bump forming portions of the plating resist by developing same. Stud bumps 108 are formed in the bump forming portions by electro-plating followed by removing the plating resist, and etching away the thin conductive layer 104. An insulating resin is applied (FIG. 6(e)) on the resulting board to form an insulating layer thereon and then an upper portion of the insulating layer is polished to provide a planarized surface 110. An upper circuit layer 112 is then formed on the planarized surface 110.

In the aforesaid process, the electro-plating is applied only to openings formed in the plating resist and, therefore, it is difficult to form bumps of a uniform height, occasionally resulting in formation of over-deposited or under-deposited bumps. This is because the current density varies depending on the distribution density of the stud bump vias and the position thereof within a work area, i.e., whether located in a central portion or a peripheral portion of the work area. In the polishing step, the over-deposited bumps may protrude due to insufficient polishing, and/or the under-deposited bumps may remain coated with the resin and thus unexposed, both of course undesirable results with respect to PCB manufacture.

For formation of a stud bump structure, the bumps should have a height equal to or greater than the thickness of the polished insulating layer, so that the plating resist should be applied to a corresponding thickness. This makes it difficult to remove small areas of resist by development to form via holes of relatively small diameters. As in the photo via method and the laser via method described above, the pretreatment prior to the plating tends to be insufficient to remove the developed resist from the bottom portion of the smaller diameter via holes, thereby possibly resulting in unreliable inter-layer connections.

When small diameter stud bumps 108 are formed, the stud bumps may have a vase-like shape with a portion 114 thereof being bulged as shown in FIG. 7. Therefore, air 116 may be trapped when the insulating layer is formed by application of a liquid insulating resin. This in turn may result in insufficient insulation reliability.

Another method referred to as open area processing is known for producing a built-up printed circuit board having a stud bump structure. Japanese Examined Patent Publication No. 7-10030 (1995) discloses a double-layered metal etching method for the build-up printed circuit board of the stud bump structure. As shown in FIGS. 8(a) to 8(f) of Applicants' drawings, this method comprises the steps of: (a) forming two layers 122, 124 of different metals on a core circuit board 120, and applying a positive resist 126 thereon; (b) subjecting the positive resist 126 to exposure and development, then etching the upper metal layer 124; (c) etching the lower metal layer 122; (d) subjecting the positive resist 126 again to exposure and development; and etching the upper metal layer 124 to form a stud bump 128. An insulating resin 130 is applied on the resulting board and cured to form an insulating layer. In FIG. 8(f), a surface portion of the insulating layer is polished to a level 132 (hidden in FIG. 8(e)), and an upper circuit layer 134 is then formed thereon.

The aforesaid method, however, requires two kinds of metals 122 and 124 and two etching steps, thereby increasing manufacturing costs. Further, as shown in FIG. 9, the stud bump formed from the upper metal layer 124 tends to have a trapezoidal shape and the etching of the lower metal layer 122 by using the upper metal layer 124 as a "mask" tends to further broaden the bottom land width. Therefore, a land 140 of the lower metal pattern layer may contact an adjacent circuit conductor, as shown in FIG. 9, to cause a circuit short, which makes fine line etching difficult.

To meet the requirements for high density packaging and fine-pitch chip-mounting on built-up printed circuit boards, it is important to form interconnection patterns with higher density and flexibility, for which various kinds of interconnection methods are proposed. Particularly, via holes for interconnection between conductive layers are required to have a smaller diameter on the order of not greater than 100 μm. There are known in the art some conventional methods for the interconnection between conductive layers, known as a photo via or laser via method, which are so-called closed-area processing wherein vias are formed in an insulator of 40 to 80 μm thickness and then plated with copper for inter-layer connection.

OBJECTS AND SUMMARY OF THE INVENTION

It is an object of the present invention to provide an inter-layer connection structure with a bump via of a small diameter for interconnection between lower and an upper electrical circuits. The bump via can be formed at lower costs with a higher yield by curving a copper foil on a substrate by a controlled etching method (herein referred to as "etch down"), while using a conventional production process and materials for printed circuit boards.

It is another object of the invention to ensure higher interconnection reliability by interconnecting a bump via and an upper circuit in the plane of a resin layer by metal plating.

It is still another object of the invention to provide a multi-layer printed circuit board which includes bump vias filled with conductive material and having a planarized top face to allow higher density interconnection between the bump vias being stacked, and ensure higher interconnection reliability even where a bare chip is mounted on the bump vias.

In accordance with the present invention, there is provided a process for producing an inter-layer connection structure for interconnection between lower and upper electrical circuits, the process comprising the steps of: forming a resist pattern layer on a core circuit board including a substrate with a metal layer formed thereon; isotropically etching the metal layer to a selected depth by an etch down method to make a bump via; forming a lower pattern layer below the bump via by exposure and development of a positive resist and etching of the remaining metal layer; forming an insulating resin layer on the resulting board; and forming an upper pattern layer on the resulting board by polishing and roughening of the insulating layer and copper plating.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals may be used to indicate like elements from FIG. to FIG.

With the arrangement according to the present invention, it will be understood that smaller diameter bump vias can be formed at lower costs and with a higher product yield. Further, the present invention substantially overcomes bump height unevenness and unreliable interconnection problems associated with conventional via post methods. Still further, smaller diameter bump vias having higher interconnection reliability can be produced without the complicated process steps required in the aforementioned double-layered metal etching method.

With reference to the drawings, the present invention will hereinafter be described by way of embodiments thereof. However, it should be understood that the invention should not be limited to these embodiments.

The term "bump via" as used herein means an inter-layer connection structure which has a bump structure and functions as a conductive via conventionally employed in a multi-layer printed circuit board.

The term "isotropic etching" as used herein means that a metal layer on a substrate is uniformly etched, whether the primary etching position is located at a central or peripheral portion of the substrate.

The term "etch-down method" as used herein means that a metal layer is isotropically etched to a predetermined depth to leave a lower portion of the metal layer remaining (unetched).

Figure 1A:
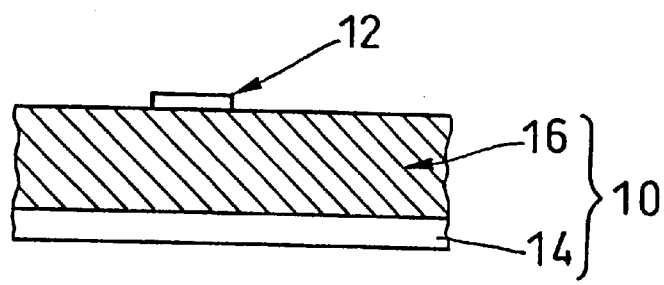
FIGS. 1(a) to (f) illustrate one exemplary process for producing a multi-layer circuit board according to the present invention.

As shown in FIG. 1(a), an etching resist 12 on a core circuit board 10 is exposed and developed. The core circuit board comprises a substrate 14 with a metal layer 16 formed thereon. The material for the substrate 14 is not particularly limited, but examples thereof include common materials such as glass epoxy, organic materials such as synthetic resins including polyester and polyimide, ceramic materials such as silicon carbide and alumina, metallic materials, inorganic materials such as silicon glass, and composites of any of these materials. The substrate may have any thickness suitable for the intended application, and may even be so thin as to possess flexibility. The substrate may include internal circuits, as is known in the art.

Usable as the material for the metal layer 16 are various metals such as copper, aluminum and chromium, among which copper is preferred because of its high heat conductivity and high electric conductivity. The metal layer 16 preferably has a thickness of not less than 40 $\mu$m. The formation of the metal layer 16 may be achieved by bonding a metal foil onto the substrate or by metal plating the substrate, e.g., by a conventional wet deposition process. The metal layer is uniformly formed over the substrate within a work area. The metal layer is later etched to form conductors including bump vias and a lower circuit pattern, as described below. Since the bump via is formed integrally with its associated lower circuit conductor, the reliability of interconnection between the lower circuit pattern, the bump via and an upper circuit pattern can be improved using the teachings described hereinbelow.

Application of resist 12 can be achieved in any manner conventionally known to those skilled in the art, for example, by laminating a dry resist, applying a liquid resist or electro-depositing an ED resist on the substrate.

Figure 2A:
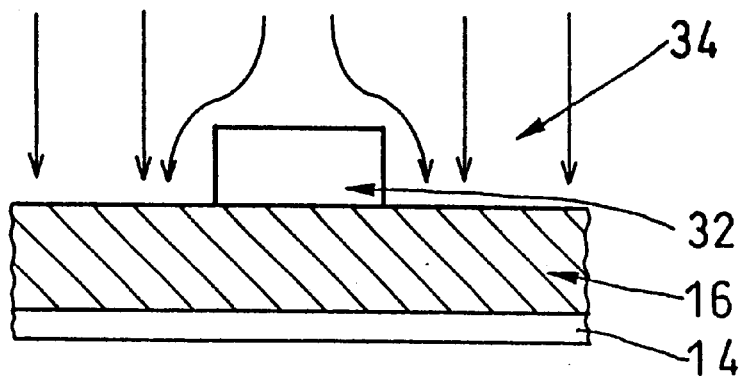
FIGS. 2(a) and 2(b) are schematic diagrams showing a relationship between a resist thickness and an etching flow rate.
Figure 2B:
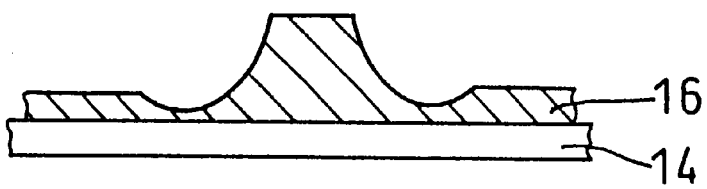

The thickness of the resist is typically not greater than 30 $\mu$m, preferably not greater than 20 $\mu$m, and more preferably not greater than 15 $\mu$m. As shown in FIGS. 2(a) and 2(b), the flow rate or the flow amount per unit time of a liquid etchant 34 flowing around a bump tends to increase as the thickness of the resist (32 in FIG. 2(a)) increases. Particularly, a resist thickness of 40 $\mu$m or greater is not preferred, because a portion of the lower circuit pattern around the bump becomes thinner or is lost due to over-etching, resulting in unreliable inner-layer interconnection.

After the application of the etching resist, the etching resist is exposed and developed so as to leave the resist at bump via forming regions and expose all other regions of the metal layer.

Next, the metal layer 16 is etched down. More specifically, the etch-down is carried out by isotropic etching. In the present invention, the height of the bump vias and the thickness of the lower circuit layer should be made uniform for formation of the inter-layer connection structure and, therefore, the etching performance is particularly important.

Figure 3A:
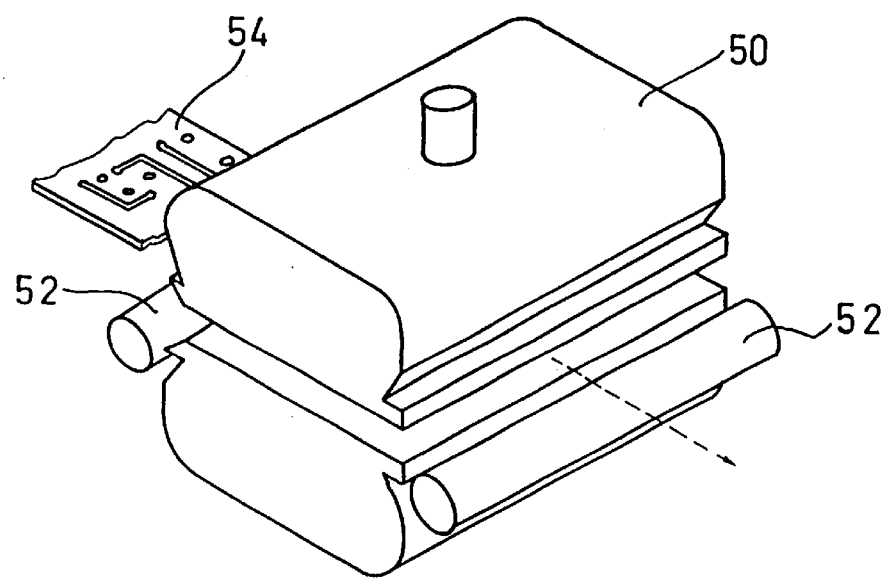
FIGS. 3(a) and 3(b) illustrate isotropic etching apparatus suitable for use in the invention.

The isotropic etching of metal layer 16 is carried out by properly adjusting the flow amount, flow rate and flow direction of the liquid etchant, and the immersion period. For isotropic etching, a device such as described in U.S. Pat. No. 5,483,984 may be used. As shown in FIG. 3(a), the device includes a head 50 for ejecting a liquid etchant onto the entire substrate at a predetermined flow rate, and cylindrical squeegee rollers 52 provided at the entrance and exit of head 50. The substrate 54 is uniformly etched with the liquid etchant-supplied thereto, while being moved (in the direction indicated by an arrow) through the area between the rollers 52.

Figure 3B:
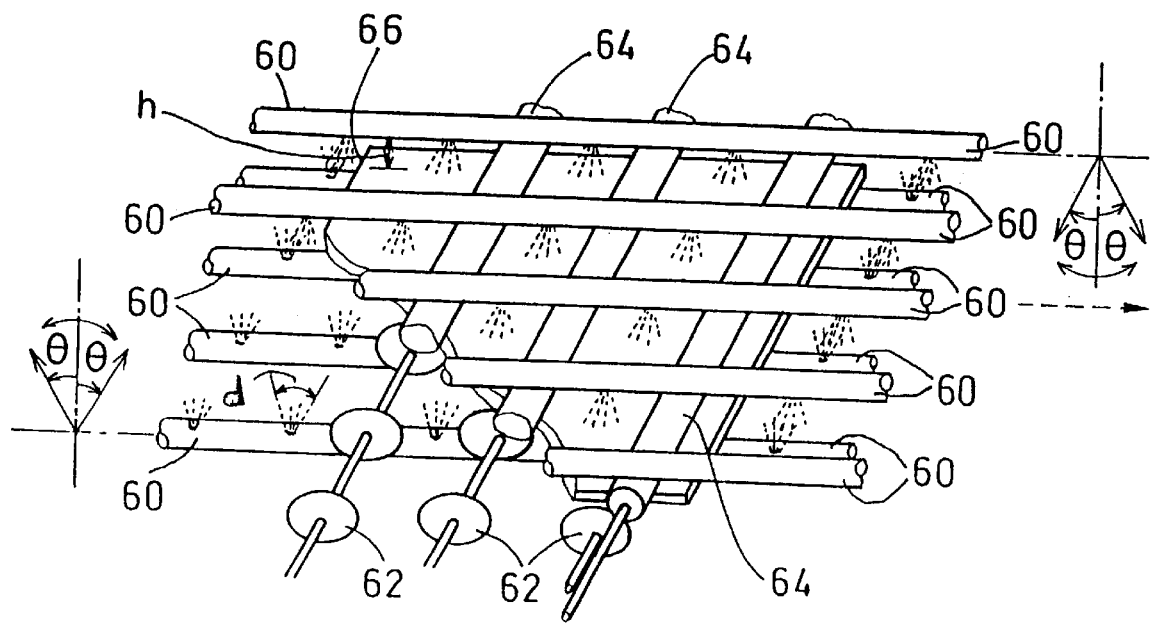

Another useful device to accomplish the isotropic etching is shown in FIG. 3(b), which includes two sets of upper and lower spray nozzles 60 disposed in a perpendicular or inclined relation with respect to squeegee rollers 64. The spray nozzles 60 are spaced a predetermined distance (h) from substrate 66 and adapted to swing within a predetermined angle $\ominus$ for spraying the liquid etchant. The device further includes ring rollers 62 adapted to contact a lower surface of the substrate 66, and squeegee rollers 64 adapted to contact the opposing upper surface of the substrate. Substrate 66 is transported through a space defined between the ring rollers 62 and the squeegee rollers 64. The distance (h) from the substrate is sufficient to space the substrate apart from outlets of the spray nozzles to assure uniform spraying of the liquid etchant over the substrate. In one example, h may be about 100 $\mu$m. The uniform spraying of the liquid etchant over the substrate is also ensured by the swing of the nozzles, the swing angle ($\ominus$) preferably 15 to 25 degrees. The spray angle of the liquid etchant from the outlets of the nozzles is about 70 degrees. This spray angle is represented by the letter d in FIG. 3b. When the metal layer is formed of copper, a solution of ferric chloride or cupric chloride, for example, is used as the liquid etchant.

Figure 1B:
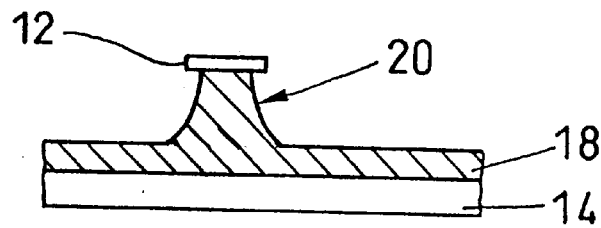

In the etching step described above, the etching is stopped at such a time that the bump vias have a desired height and a lower portion 18 of the metal layer 16 remains on the substrate, as shown in FIG. 1(b), for formation of the bump via 20. As clearly seen in FIGS. 1(b) and 1(c), the copper layer 16 is not entirely etched through, which accounts for portion 18 adjacent bump 20, as shown, not having parts thereof removed to expose substrate 14. Only one bump via 20 is shown in FIG. 1 for simplification. The thickness of the remaining metal layer 18 is at least 10 $\mu$m or greater to ensure high inner-layer connection reliability.

The bump vias thus formed are of a substantially truncated cone or trapezoidal shape with the bottom face thereof having a greater diameter than the corresponding top face. Therefore, even if a liquid insulating resin is used as an inter-layer insulator, air entrapment, which may occur in the via post method described above, is prevented. Since the bump vias are formed by open area processing and do not involve the problems associated with closed area processing, uniformity of size is assured. The bump vias formed according to the present invention ensure higher connection reliability to meet the requirements for higher density packaging, even though the upper surface of each bump via as its contact portion may have a diameter of less than 100 $\mu$m or even less than about 50 $\mu$m.

Figure 1C:
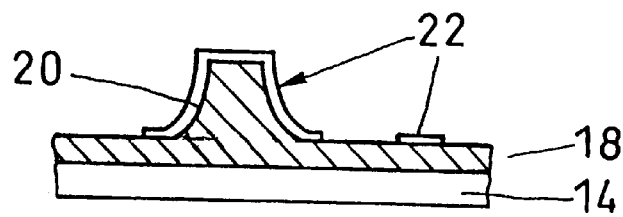

Before formation of an etching resist film on the surfaces of the bumps and the lower metal layer 18, the metal surfaces are pretreated to be roughened for improvement of adhesion of the resist to the metal surfaces. The pretreatment is achieved not by a mechanical polishing method (such as buffing) which may damage the formed bump via, but instead by a jet scrubbing method which involves application of a high pressure water jet containing abrasive particles (such as aluminum oxide), by a chemical etching method, or the like. After the pre-treatment, a positive-working electrodeposited resist 22 is applied on the resulting board to form the resist film, which is then exposed and developed as shown in FIG. 1(c). The formation of the positive-working electrodeposited resist film is achieved by means of an electro-deposition mechanism known to those skilled in the art (see, e.g., the article by Jeff Doubrava et al., in CIRCUITREE Magazine, May 1995). Since other resist film forming methods (such as applying dry resist or liquid resist) cannot form a uniform thickness of resist film on both the side surface of the bump and on the top face of the bump, it is impossible to stably form the bump via. Where a negative-working electrodeposited resist is employed, the resist film on the side of the bump will not be sufficiently exposed thereby to be dissolved at the development, which will result in undesired etching of the bump via.

The positive-working electrodeposited resist as used in the instant invention is free from the aforesaid drawbacks, and capable of forming a resist film of uniform thickness on all exposed surfaces of bump 20. More specifically, methods for the formation of the positive-working electrodeposited resist film are classified into an anionic type and a cationic type, depending on the kind of the resist to be used, and either type may be used in the present invention. In an anionic type method, a direct current is passed between a substrate as an anode and a stainless plate as a counter cathode in an aqueous solution for dispersion of a carboxylic resin to deposit a resist film on the substrate. In a cationic type method, the formation of a resist film is achieved by employing an amine resin or the like with a substrate and a stainless plate used as the cathode and anode, respectively. Should non-collimated light be used for this exposure, scattering of the light makes it almost impossible to form a fine line pattern having a predetermined small width dimension. Collimated light is thus used to expose a circuit pattern for the lower metal layer 18.

Since the bumps formed through the process according to the present invention have a uniform height, it is possible to place a glass mask on the top face of the bumps which serve as a reference plane and, with a distance between the glass mask and the lower metal layer being kept constant, carry out proximal exposure by using collimated light. The bump via process of the present invention makes it possible to form a uniform height of bump vias and keep the distance between the mask and the lower metal layer constant. Therefore, the circuit is free from "blooming" or other irregularities which may occur due to refraction. The proximal exposure as taught herein allows the formation of a fine line less than 20 $\mu$m in width.

Figure 1D:
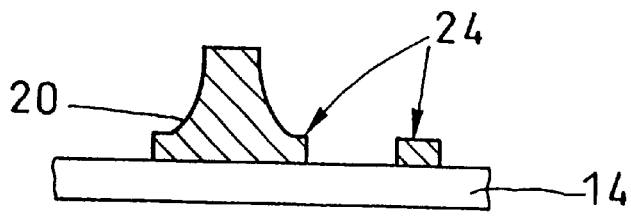
Figure 1E:
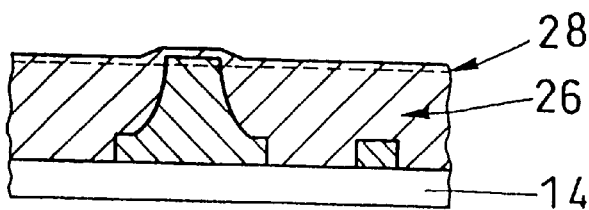
Figure 1F:
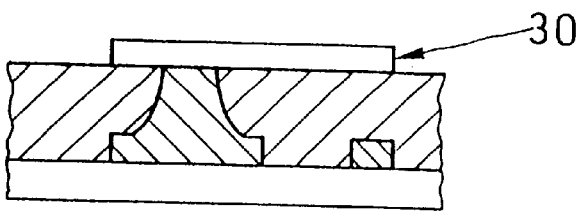

After the development of the resist, the remaining metal layer 18 is etched to form a lower circuit pattern 24, as shown in FIG. 1(d). As clearly seen in FIG. 1(d), the portions of lower portion 18 of metal layer 16 which form the elements of circuit pattern 24 are not removed. By selecting the size of the resist film on the bump 20 and the appropriate etching rate, the size of the lands under the bump vias can also be minimized for higher interconnection density of the lower circuit pattern. Then, an insulating layer 26 is formed by laminating or heat-pressing an insulating film or applying a liquid type of insulator onto the resulting board as shown in FIG. 1(e).

The formation of insulating layer 26 can be achieved by any of known methods, for example, by applying a liquid insulating resin and curing the resin. The formation of the insulating layer 26 is more preferably achieved by stacking a semi-cured resin sheet or copper clad resin sheet and pressing it against the board with a metal plate by a vacuum heat press method. As stated above, bump vias formed in accordance with the present invention have a uniform height and therefore, the resin on the top surfaces of the bump vias after the pressing step is also uniform in thickness and can be very thin, which in turn minimizes a polishing operation for planarization. Since the insulator forming process is performed under vacuum, air entrapment of insulator voids is substantially prevented. Therefore, the method taught herein is effective in ensuring higher insulation reliability. Any of the various known insulating resins may be used in the semi-cured state, with examples thereof including epoxy resins, acrylic resins and polyimide resins. By choosing a highly insulating resin, the thickness of the insulating layer and thus the height of the bump vias of the invention can be reduced. This allows reduction in the diameter of the bump via.

When a copper clad resin sheet is stacked on the board, the upper surface copper foil of the sheet is etched away after lamination. Thereafter, top surfaces of the bump vias are exposed to ambient air by polishing, resulting in the configuration shown in FIG. 1(e) (as the hidden line). The polishing for planarization may be achieved by any known method such as a buff polisher or a belt sander. An upper portion of the insulating layer 26 is polished away to a polishing level 28 (hidden line). The polished surface of the insulating layer is then roughened, e.g., with sodium permanganate or the like. Then, an upper circuit pattern 30 is formed on the roughened surface, e.g., by metal plating.

Figure 4:
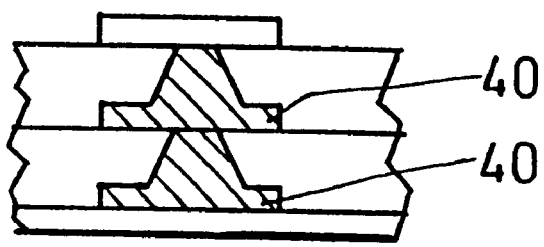
FIGS. 4(a) and 4(b) illustrate embodiments of the multi-layer circuit board according to the invention.
Figure 4:
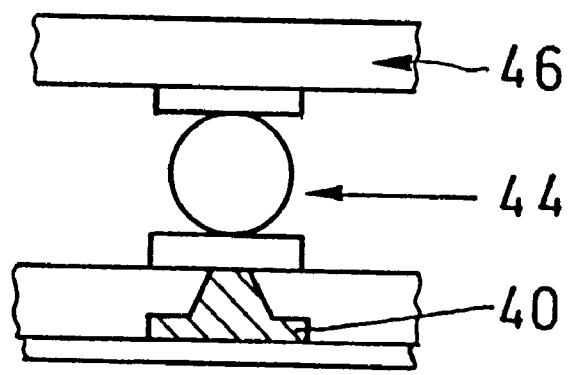
Figure 5A:
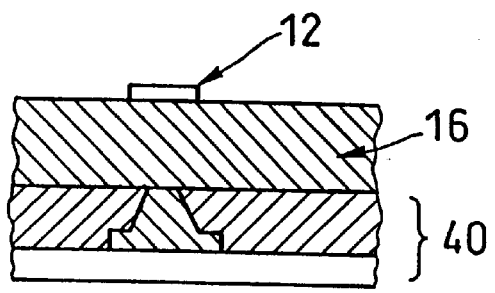
FIGS. 5(a) to 5(f) illustrate another exemplary process for producing a multi-layer circuit board according to the invention.
Figure 5B:
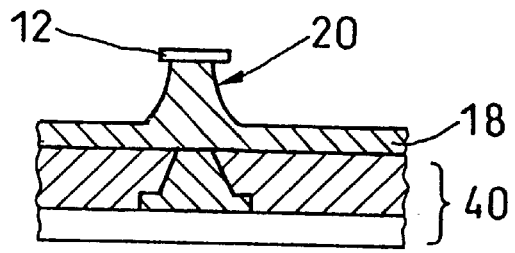
Figure 5C:
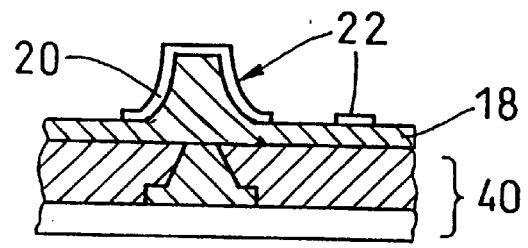
Figure 5D:
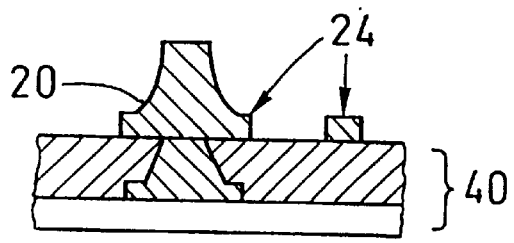
Figure 5E:
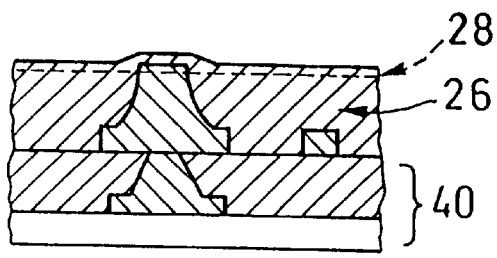
Figure 5F:
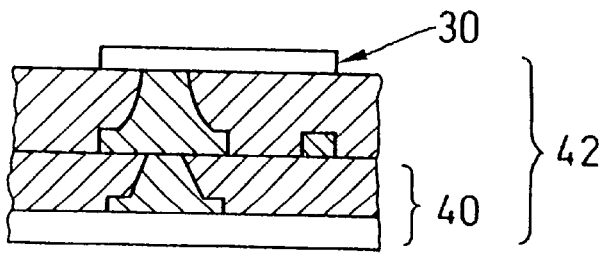
Figure 6A:
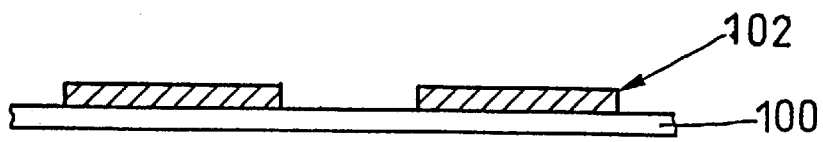
FIGS. 6(a) to 6(f), as described above, illustrate an exemplary via post method of the prior art.
Figure 6B:
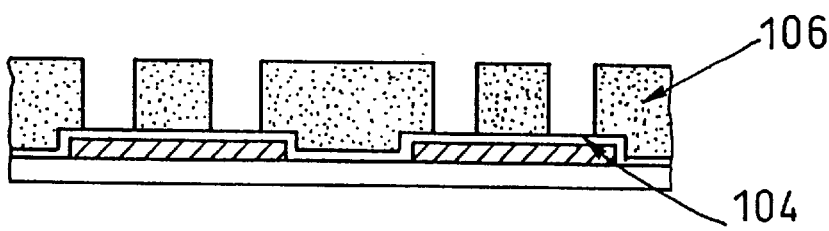
Figure 6C:
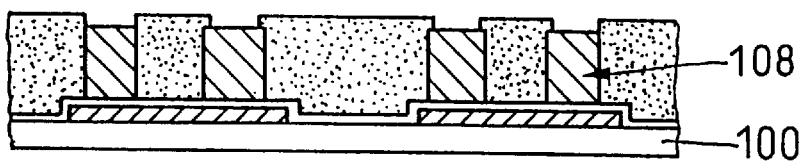
Figure 6D:
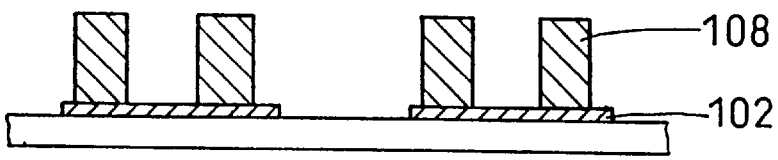
Figure 6E:
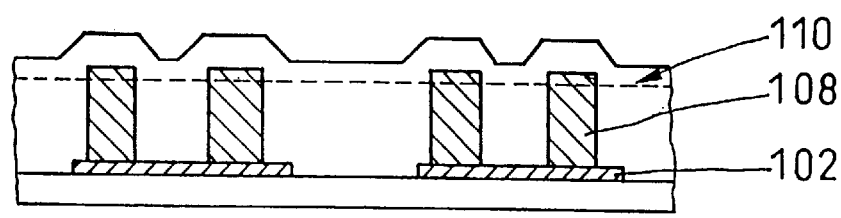
Figure 6F:
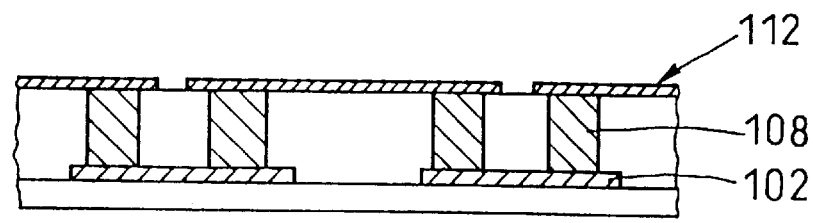
Figure 7:
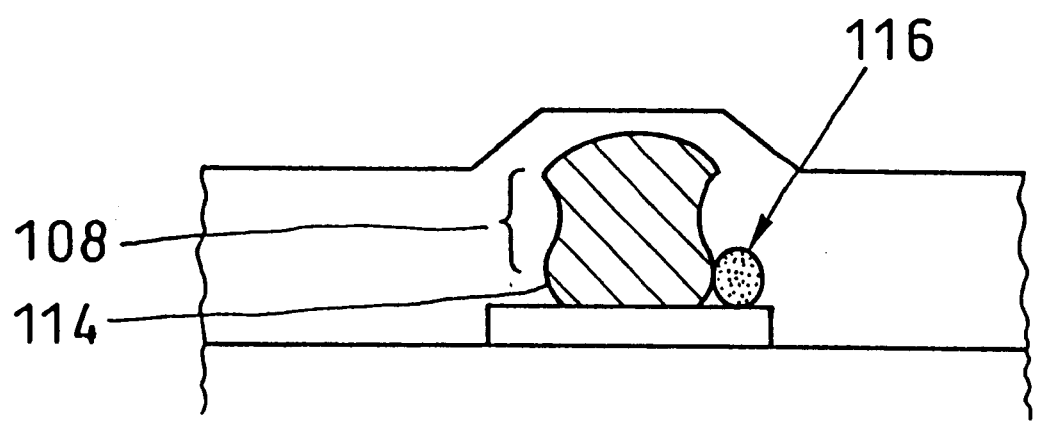
FIG. 7 illustrates air trapping which is liable to occur in the via post method.
Figure 8A:
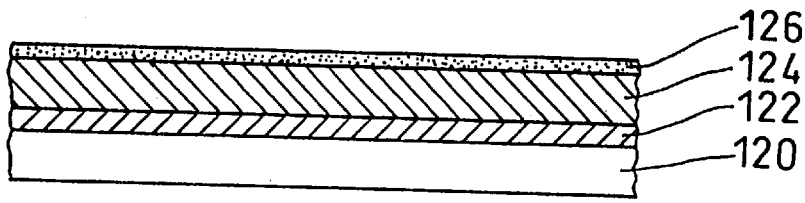
FIGS. 8(a) to 8(f), as described above, illustrate an exemplary double-layered metal etching method of the prior art.
Figure 8B:
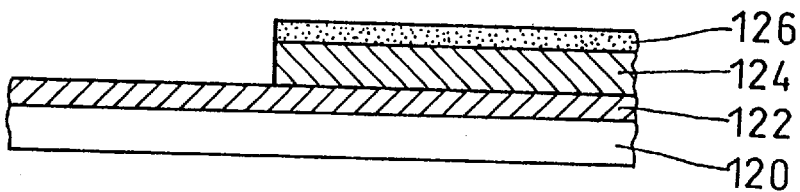
Figure 8C:
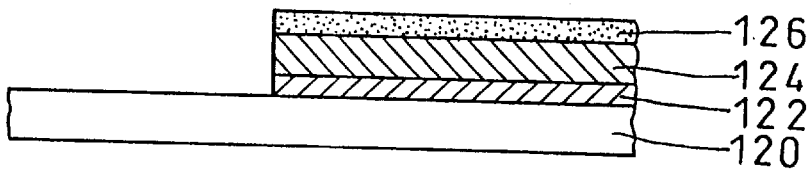
Figure 8D:
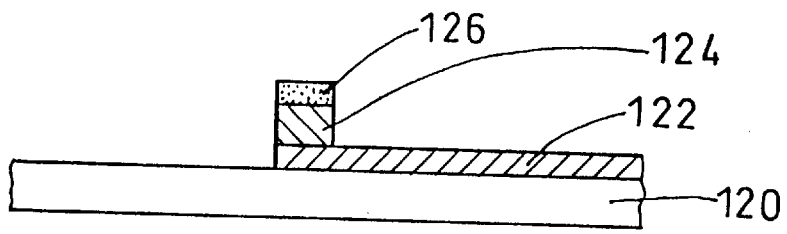
Figure 8E:
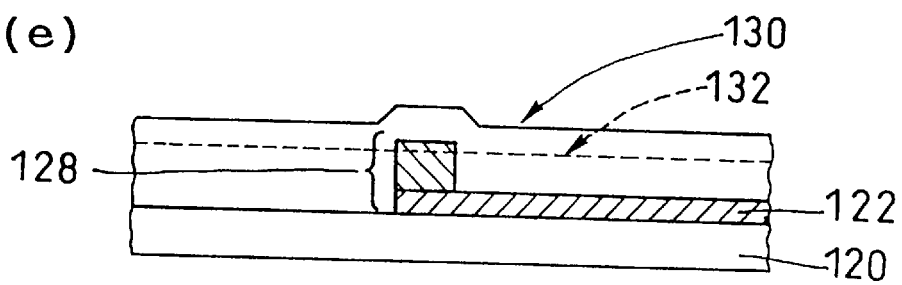
Figure 8F:
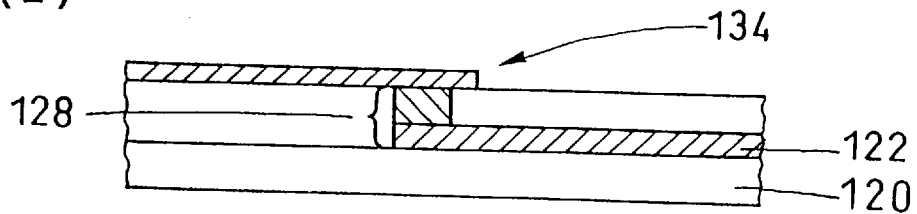
Figure 9:
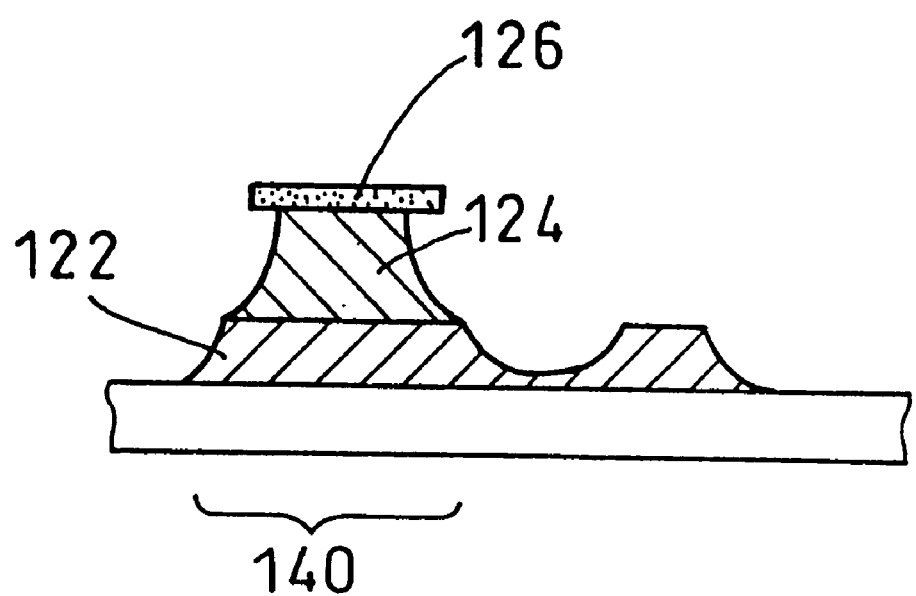
FIG. 9 illustrates a short circuit between adjacent conductors which is liable to occur in the double-layered metal etching method of the prior art.

FIG. 4(a) illustrates an embodiment of a multi-layer printed circuit board according to the present invention, in which two bump vias having the same configuration and formed in the aforesaid manner are stacked one above the other. FIGS. 5(a) to 5(f) illustrate a production process for making such a multi-layer printed circuit board. As shown in FIG. 5(a), a metal layer 16 is formed over the bump via 40 formed in the aforesaid manner by plating. To secure the reliability of inter-layer connection, the formation of the metal layer 16 is preferably achieved by plating, at a thickness of preferably 50 to 90 $\mu$m. Usable as the material for the metal layer are various metals such as copper, aluminum and chromium, among which copper is preferred because of its high heat conductivity and electrical conductivity. A resist pattern 12 is formed in the aforesaid manner (FIG. 5(a)), and a bump via 20 is formed by isotropic etching which leaves a thinned metal layer 18 (FIG. 5(b)). Then, a lower circuit pattern 24 is formed by exposure and development of a positive-working electrodeposited resist layer 22 and etching of the remaining metal layer 18 (FIG. 5(c), 5(d)). Then, an insulating resin layer 26 is formed (FIG. 5(e)), planarized (by polishing) and roughened. Finally, an upper circuit pattern 30 is formed by copper plating (FIG. 5(f)). The multi-layer printed circuit board may include more than two levels of bump vias stacked in the aforesaid manner.

The present invention obviates the need for a via filling step. As shown in FIG. 4(b), a bare chip 46 can be directly mounted on the bump via 40 by a solder bump 44. The present invention makes it possible to form smaller diameter vias with the top surfaces thereof being coplanar at lower costs. Therefore, the design flexibility of a built-up multi-layer printed circuit board can be increased to meet the requirements for higher density wiring. Since the top face of the via can have a small diameter compared to conventional vias, it allows larger tolerance for misregistration with the upper circuit pattern to which it is coupled. Further, the insulating resin layer is not necessarily photosensitive resin as required in some conventional photo via methods. This gives a wider flexibility of choice of resins.

While the embodiments of the present invention have thus been described with reference to the drawings, it should be understood that the invention be not limited to the embodiments exemplified or illustrated in the drawings. In the foregoing explanation with reference to the drawings, the multi-layer circuit layer is formed only on one side of the substrate, but may be formed on both sides of the substrate. In this manner, various modifications, alterations and changes may be made to the embodiments on the basis of knowledge of those skilled in the art without departing from the scope of the present invention.

What is claimed is:

1. A process for producing an inter-layer connection structure for inter-layer connection between a lower electrical circuit and an upper electrical circuit, comprising the steps of:

providing a core circuit board including a substrate and a metal layer positioned on one side of said substrate;

applying a photoresist onto said metal layer of said core circuit board, and exposing and developing said photoresist to leave a photoresist pattern on a portion of said metal layer;

etching said metal layer to a depth but not entirely through said metal layer to form at least one bump via from said metal layer having sides and an upper surface while leaving a lower portion of said metal layer on said side of said substrate;

applying a photoresist onto said lower portion of said metal layer and onto said sides and upper surface of said at least one bump via to form a lower electrical circuit pattern in said lower portion, said forming of said lower electrical circuit pattern including removing said lower portion of said metal layer except for portions of said lower portion of said metal layer which form said electrical circuit pattern;

forming an insulating layer on said lower electrical circuit and said at least one bump via;

polishing said insulating layer to expose an upper surface of said at least one bump via; and forming an upper electrical circuit on said insulating layer in electrical contact with said at least one bump via.

2. The process as set forth in claim 1, wherein said etching is accomplished using isotropic etching.

3. The process as set forth in claim 1, wherein said photoresist applied onto said lower portion of said metal layer and said at least one bump via is applied as a positive-working photoresist.

4. The process as set forth in claim 1, wherein said etching of said metal layer is achieved by an isotropic etch down method.

5. The process as set forth in claim 4, wherein said lower metal layer portion resulting from said etching includes a thickness of at least 10 $\mu$m.

6. The process as set forth in claim 1, wherein said upper surface of said at least one bump via has a diameter of not greater than 100 $\mu$m.

7. The process as set forth in claim 1, wherein said photoresist applied onto said lower portion of said metal layer is exposed by a collimated light exposure.

8. The process as set forth in claim 1, wherein said insulating layer is formed by pressing a semi-cured resin sheet onto said lower electric circuit.

9. The process as set forth in claim 8 wherein said pressing of said semi-cured resin sheet is accomplished using a metal plate and a vacuum.

10. The process as set forth in claim 1 further comprising the step of stacking at least one of said bump vias onto another bump via also produced in accordance with the process of claim 1 to form a multi-layer printed circuit board.

11. A process for producing an inter-layer connection structure for inter-layer connection between a lower electrical circuit and an upper electrical circuit, comprising the steps of:

provoking a core circuit board including a substrate and a metal layer positioned on one side of said substrate;

applying a photoresist onto said metal layer of said core circuit board, and exposing and developing said photoresist to leave a photoresist pattern on a portion of said metal layer;

etching said metal layer to a depth but not entirely through said metal layer to form at least one bump via from said metal layer of a substantially truncated cone or trapezoidal shape having sides and an upper surface while leaving a portion of said metal layer on said side of said substrate;

applying a photoresist onto said lower portion of said metal layer and said at least one bump via including to said sides and upper surface of said bump via, to form a lower electrical circuit pattern in said lower portion, said forming of said lower electrical circuit including removing said lower portion of said metal layer except for portions of said lower portion of said metal layer which form said electrical circuit pattern;

forming an insulating layer on said lower electrical circuit and said at least one bump via;

polishing said insulating layer to expose said upper surface of said at least one bump via; and forming an upper electrical circuit on said insulating layer in electrical contact with said at least one bump via.

12. The process as set forth in claim 11, wherein said etching is accomplished using isotropic etching.

13. The process as set forth in claim 11, wherein said photoresist applied onto said lower portion of said metal layer and said at least one bump via is applied as a positive-working photoresist.

14. The process as set forth in claim 11, wherein said etching of said metal layer is achieved by an isotropic etch down method.

15. The process as set forth in claim 14, wherein said lower metal layer portion resulting from said etching includes a thickness of at least 10 $\mu$m.

16. The process as set forth in claim 11, wherein said upper surface of said at least one bump via has a diameter of not greater than 100 $\mu$m.

17. The process as set forth in claim 11, wherein said photoresist applied onto said lower portion of said metal layer is exposed by a collimated light exposure.

18. The process as set forth in claim 11, wherein said insulating layer is formed by pressing a semi-cured resin sheet onto said lower electric circuit.

19. The process as set forth in claim 18, wherein said pressing of said semi-cured resin sheet is accomplished using a metal plate and a vacuum.

20. The process as set forth in claim 11, further comprising the step of stacking at least one of said bump vias onto another bump via also produced in accordance with the process of claim 11 to form a multi-layer printed circuit board.

\* \* \* \* \*